US012633252B1

(12) United States Patent
Wang et al.

(10) Patent No.: US 12,633,252 B1
(45) Date of Patent: May 19, 2026

(54) MULTI-PATH POWER SUPPLY DISPLAY SYSTEM HAVING CASCADED MODULES DRIVING LED UNIT AND CONTROL METHOD THEREOF

(71) Applicants: Huayuan semiconductor (shenzhen) limited company, Shenzhen (CN); Huayuan semiconductor (tianjin) limited company, Tianjin (CN)

(72) Inventors: Yujun Wang, Tianjin (CN); Honglai Wang, Tianjin (CN); YuFeng Zou, Tianjin (CN); Xiang Xia, Shenzhen (CN); Zhangyi Zhu, Tianjin (CN)

(73) Assignees: Huayuan semiconductor (shenzhen) limited company, Shenzhen (CN); Huayuan semiconductor (tianjin) limited company, Tianjin (CN)

( * ) Notice: Subject to any disclaimer, the term of this patent is extended or adjusted under 35 U.S.C. 154(b) by 0 days.

(21) Appl. No.: 19/076,273

(22) Filed: Mar. 11, 2025

(51) Int. Cl.
*G09G 3/32* (2016.01)
*H03K 17/687* (2006.01)
*H03K 19/20* (2006.01)

(52) U.S. Cl.
CPC .......... *G09G 3/32* (2013.01); *H03K 17/6872* (2013.01); *H03K 19/20* (2013.01); *G09G 2330/021* (2013.01)

(58) Field of Classification Search
CPC ........................................................ G09G 3/32
USPC ............................................................ 345/212
See application file for complete search history.

(56) References Cited

U.S. PATENT DOCUMENTS

| | | | | | |
|---|---|---|---|---|---|
| 5,208,492 | A | * | 5/1993 | Masumoto | G11C 7/1057 |
| | | | | | 326/50 |
| 2010/0201278 | A1 | * | 8/2010 | Zhao | H05B 45/46 |
| | | | | | 315/297 |
| 2021/0020121 | A1 | * | 1/2021 | Ueno | G09G 3/3685 |
| 2023/0343274 | A1 | * | 10/2023 | Wu | G06F 3/1423 |

* cited by examiner

*Primary Examiner* — Long D Pham
(74) *Attorney, Agent, or Firm* — NZ Carr Law Office

(57) ABSTRACT

A display system includes a data control chip, N cascaded modules, and N pull-up resistors. Each cascaded module includes M driver units connected in series and correspondingly controlled LED units. An input terminal of the first driver unit is coupled to an output terminal of the data control chip, an output terminal of an M$^{th}$ driver unit is coupled to an input terminal of the data control chip, each driver unit is coupled to a first power supply voltage. Each driver unit is integrated with a CMOS output structure and an open-drain output structure. The data control chip is configured to control each driver unit in a corresponding cascaded module to be switched between the CMOS output structure and the open-drain output structure. Each pull-up resistor is corresponding to one cascaded module, and is coupled between an output terminal of the corresponding cascaded module and a second power supply voltage.

17 Claims, 2 Drawing Sheets

MULTI-PATH POWER SUPPLY DISPLAY SYSTEM HAVING CASCADED MODULES DRIVING LED UNIT AND CONTROL METHOD THEREOF

TECHNICAL FIELD

The present application relates to the display field, and in particular relates to a multi-power-supply display system and a control method therefor, and a display device.

BACKGROUND

With the development of display technology and the reduction of the price of mini-LED lamp beads, mini-LED backlight has been increasingly used in display systems, such as notebooks, vehicle central control screens, and televisions. Generally, a whole backlight system includes a BCON and a plurality of cascaded driver chips. The BCON is configured to receive data from a front-end SOC of a television and control all driver chips in a display system at the same time. The driver chip is configured to output a current and control a mini-LED lamp bead in its region. Since the BCON and the driver chip are usually made using different semiconductor processes, power supplies of the BCON and the driver chip are often different. For example, the BCON needs a supply voltage of 3.3 V, but the driver chip that needs to drive the mini-LED lamp bead needs a supply voltage of 5 V or more. Therefore, how to solve a problem of voltage domain conversion between the BCON and the driver chip is particularly important.

When only a few driver chips, for example, one to a dozen driver chips, are cascaded in the display system, conventionally, an open-drain output structure is generally used as an output structure of the driver chip. Through a pull-up resistor of the last driver chip, a signal output by the driver chip is pulled to a voltage domain of the BCON. Although the pull-up resistor generates additional power consumption, it does not have much impact on functions of the display system because there are not many cascaded driver chips. However, when there are too many cascaded driver chips, for example, hundreds or thousands of driver chips, in the display system, the display system divides the driver chips into a plurality of channels, and the same quantity of driver chips are cascaded in each channel. If the driver chip still employs the open-drain output structure, the problem of power consumption caused by the pull-up resistor will affect the normal operation of the display system. Certainly, power consumption may be reduced by increasing a resistance value of the pull-up resistor, but this will affect a transmission rate of signals between the driver chips. Therefore, it is difficult to make a good compromise between system power consumption and a signal transmission rate by using the open-drain output structure. Therefore, in the prior art, the open-drain output structure in the driver chip is replaced with a CMOS output structure, to eliminate the pull-up resistor, which can not only solve the problem of the system power consumption, but also increase the signal transmission rate. However, there is a problem that the CMOS output structure cannot solve the problem of voltage domain conversion between the BCON and the driver chip. Therefore, an additional level conversion circuit needs to be added between an output terminal of the last driver chip and the BCON, but this will increase a circuit area of the display system, thereby increasing circuit costs.

Therefore, providing a low-power-consumption and low-cost display system has become an urgent technical problem to be solved in this industry.

SUMMARY

To solve the aforementioned problem, the present application provides a multi-power-supply display system and a control method therefor, and a display device.

According to a first aspect of the present application, provided is a multi-power-supply display system, including: a data control chip, N cascaded modules, and N pull-up resistors, where each cascaded module includes M driver units connected in series and correspondingly controlled LED units; an input terminal of the first driver unit is coupled to an output terminal of the data control chip, an output terminal of an $M^{th}$ driver unit is coupled to an input terminal of the data control chip, and each driver unit is coupled to a first power supply voltage; each driver unit is integrated with a CMOS output structure and an open-drain output structure;

the data control chip is configured to receive front-end data, and output a corresponding control instruction to the first driver unit of a corresponding cascaded module according to the front-end data, to control each driver unit in the corresponding cascaded module to be switched between the CMOS output structure and the open-drain output structure;

each pull-up resistor is corresponding to one cascaded module, and is coupled between an output terminal of the corresponding cascaded module and a second power supply voltage; and the second power supply voltage is used to supply power to the data control chip, and the first power supply voltage is greater than the second power supply voltage, where both N and M are positive integers, N≥1, and M≥1.

Optionally, the driver unit includes a first MOS transistor, a second MOS transistor, a third MOS transistor, an OR gate, a first resistor, a second resistor, and a logic control subunit; and a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; a first output terminal of the logic control subunit is respectively coupled to an input terminal of the OR gate and a gate of the first MOS transistor, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded.

Optionally, the first MOS transistor and the third MOS transistor each include an NMOS transistor; the second MOS transistor includes a PMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

Optionally, the driver unit includes a first MOS transistor, a second MOS transistor, a third MOS transistor, a phase inverter, an OR gate, a first resistor, a second resistor, and a logic control subunit;

a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; an input terminal and an output terminal of the phase inverter are respectively coupled to a first output terminal of the logic control subunit and a gate of the first MOS transistor; the first output terminal of the logic control subunit is further coupled to an input terminal of the OR gate, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded.

Optionally, the first MOS transistor and the second MOS transistor each include a PMOS transistor; the third MOS transistor includes an NMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

Optionally, the logic control subunit includes a memory; and the memory is configured to read a control instruction input by the input terminal of the driver unit, so that the first output terminal of the logic control subunit outputs a high level or a low level.

According to a second aspect of the present application, provided is a control method for a multi-power-supply display system, used to control the multi-power-supply display system according to the first aspect and optional solutions of the present application, including:

when addressing driver units in one cascaded module, setting all M driver units to an open-drain output structure by default; and after addressing of the driver units in the cascaded module is completed, outputting, by the data control chip, a control instruction to set the first i driver units to a CMOS output structure, and to maintain the last M–i driver units in the open-drain output structure, where i is a positive integer, and $1 \leq i < M$.

Optionally, the setting all M driver units to an open-drain output structure by default specifically includes: setting a first output terminal of a logic control subunit in each driver unit to output a high level by default.

Optionally, the outputting, by the data control chip, a control instruction to set the first i driver units to a CMOS output structure specifically includes: after the first i driver units read the control instruction, switching a high level output by a first output terminal of a respective logic control subunit to a low level.

According to a third aspect of the present application, provided is a display device, including the multi-power-supply display system according to the first aspect and optional solutions of the present application.

According to the multi-power-supply display system, and the control method for a multi-power-supply display system provided by the present application, the CMOS output structure and the open-drain output structure are both integrated into the driver unit; the output structure in the driver unit is switched by using the data control chip; when addressing driver units in a cascaded module, the interior of the driver unit is set to the open-drain output structure by default; and after addressing of the driver units in the cascaded module is completed, the data control chip outputs the control instruction to set all the first i driver units to the CMOS output structure, and to maintain all the last M–i driver units in the open-drain output structure, to reduce power consumption of the display system and lower circuit costs at the same time.

BRIEF DESCRIPTION OF THE DRAWINGS

The present application is further described in detail below in conjunction with accompanying drawings and specific implementations.

REFERENCE NUMERALS

A1—cascaded module;
V1—first power supply voltage;
V2—second power supply voltage;
VLED_1—third power supply voltage;
Rpu—pull-up resistor
R1—first resistor;
R2—second resistor;
X1—OR gate;
D1—phase inverter;
Dis—input terminal;
Dos—output terminal;
Log—logic control subunit;
Q1—first MOS transistor;
Q2—second MOS transistor;
Q3—third MOS transistor.

DESCRIPTION OF EMBODIMENTS

The technical solutions in the embodiments of the present application will be described below clearly and completely with reference to the accompanying drawings in the embodiments of the present application. Clearly, the embodiments described are merely some rather than all of the embodiments of the present application. All other embodiments obtained by those of ordinary skill in the art based on the embodiments of the present application without any creative efforts shall fall within the scope of protection of the present application. The terms such as "first", "second", "third", "fourth", etc. (if any) in the description and claims of the present application and in the aforementioned accompanying drawings are used to distinguish similar objects, and are not necessarily used to describe a specific order or sequence. It should be understood that the terms used in this way can be interchanged where appropriate, so that the embodiments of the present application described herein can be implemented in a sequence other than those illustrated or described herein. In addition, the terms "include" and "have" and any variations thereof are intended to cover non-exclusive inclusion. For example, processes, methods, systems, products, or devices that contain a series of steps or units are not necessarily limited to those steps or units explicitly listed, but may include other steps or units that are not explicitly listed or inherent to these processes, methods, products, or devices.

Figure 1:
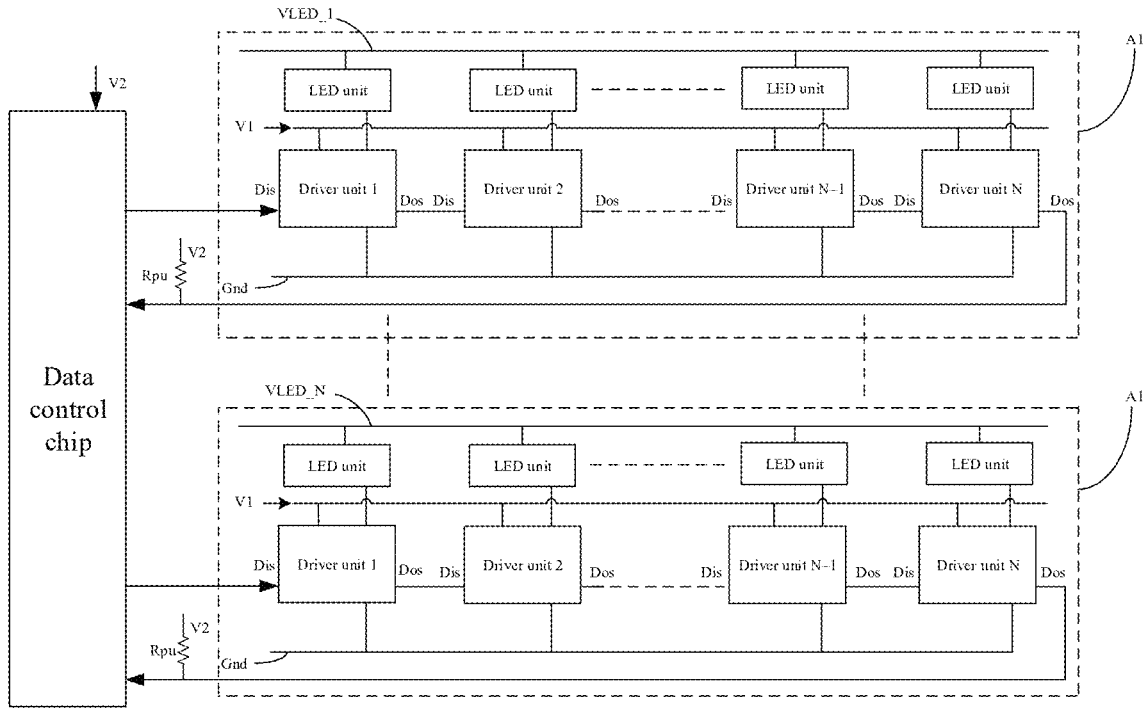
FIG. 1 is a block diagram of a structure of a multi-power-supply display system according to a first embodiment of the present application.

Referring to FIG. 1, a first embodiment of the present application provides a multi-power-supply display system, including: a data control chip, N cascaded modules A1, and N pull-up resistors Rpu.

Each cascaded module A1 includes M driver units connected in series and correspondingly controlled LED units, and each LED unit is specifically a mini-LED lamp bead, and is coupled to a third power supply voltage VLED_1. An input terminal Dis of the first driver unit is coupled to an output terminal Dos of the data control chip, an output terminal Dos of an M$^{th}$ driver unit is coupled to an input terminal Dis of the data control chip, and each driver unit is coupled to a first power supply voltage V1. Each driver unit is integrated with a CMOS output structure and an open-drain output structure.

The data control chip is configured to receive front-end data, and output a corresponding control instruction to the first driver unit of a corresponding cascaded module A1 according to the front-end data, to control each driver unit in the corresponding cascaded module A1 to be switched between the CMOS output structure and the open-drain output structure.

Each pull-up resistor Rpu is corresponding to one cascaded module A1, and is coupled between an output terminal Dos of the corresponding cascaded module A1 and a second power supply voltage V2. The second power supply voltage V2 is used to supply power to the data control chip, and the first power supply voltage V1 is greater than the second power supply voltage V2, where both N and M are positive integers, N≥1, and M≥1.

Referring to FIG. 1, the first embodiment of the present application employs the aforementioned technical solution to reduce power consumption of the display system and lower circuit costs at the same time. A specific principle is as follows:

In the prior art, output structures of driver chips are all set to the open-drain output structure or the CMOS output structure, which will lead to the increase of power consumption or costs of the display system. Therefore, in this embodiment, the open-drain output structure and the CMOS output structure are both integrated into the structure of the driver chip, and the output structure of the last driver chip or the last several driver chips is set to the open-drain output structure, so that a voltage domain of a signal output by the last driver chip is pulled down to the first power supply voltage V1 by the pull-up resistor, thereby eliminating a level conversion circuit and reducing costs. At the same time, the driver chips before the last one are all set to the CMOS output structure, thereby eliminating the pull-up resistor of the open-drain output structure and reducing power consumption of the system.

As a preferred implementation, when the display system is in communication, a signal transmission rate is affected by a resistance value of the circuit. The smaller the resistance value, the higher the signal transmission rate, and vice versa. Therefore, under the premise that the power consumption of the display system meets requirements, a pull-up resistor with a small resistance value may be selected as far as possible to increase the signal transmission rate in the system.

Figure 2:
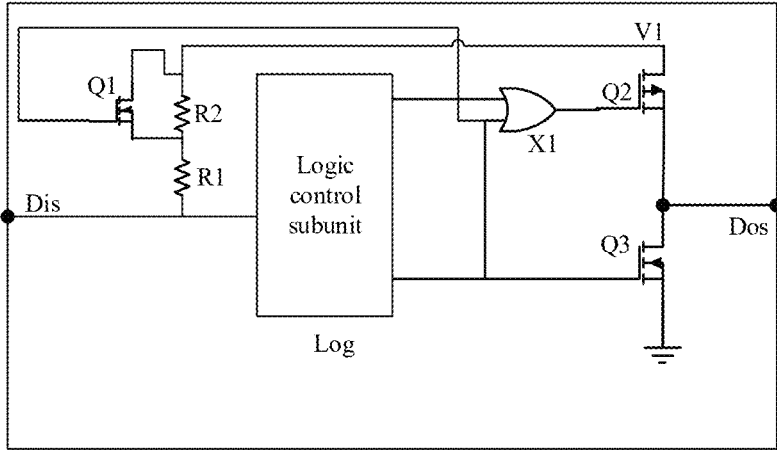
FIG. 2 is a first circuit structure diagram of a driver unit according to a first embodiment of the present application.

A specific structure of the driver chip is described below:

Referring to FIG. 2, as a preferred implementation, the driver unit includes a first MOS transistor Q1, a second MOS transistor Q2, a third MOS transistor Q3, an OR gate X1, a first resistor R1, a second resistor R2, and a logic control subunit Log.

A first terminal of the first resistor R1 and an input terminal Dis of the logic control subunit Log are both coupled to an input terminal Dis of the driver unit. A second terminal of the first resistor R1 is coupled to a first terminal of the second resistor R2, and a second terminal of the second resistor R2 is coupled to the first power supply voltage V1. A first terminal and a second terminal of the first MOS transistor Q1 are respectively coupled to the first terminal and the second terminal of the second resistor R2. A first output terminal Dos of the logic control subunit Log is separately coupled to an input terminal Dis of the OR gate X1 and a gate of the first MOS transistor Q1, and a second output terminal Dos of the logic control subunit Log is separately coupled to a gate of the third MOS transistor Q3 and the input terminal Dis of the OR gate X1. An output terminal Dos of the OR gate X1 is coupled to a gate of the second MOS transistor Q2. A second terminal of the second MOS transistor Q2 is coupled to the first power supply voltage V1, and a first terminal of the second MOS transistor Q2 is coupled to a first terminal of the third MOS transistor Q3, and serves as an output terminal Dos of the driver unit. A second terminal of the third MOS transistor Q3 is grounded.

Specifically, the first MOS transistor Q1 and the third MOS transistor Q3 each include an NMOS transistor; the second MOS transistor Q2 includes a PMOS transistor; if the first output terminal Dos of the logic control subunit Log outputs a high level, the driver unit is switched to the open-drain output structure; and if the first output terminal Dos of the logic control subunit Log outputs a low level, the driver unit is switched to the CMOS output structure.

Referring to FIG. 2, its principle is as follows:

When the first output terminal Dos of the logic control subunit Log outputs a high level, the first MOS transistor Q1, as an NMOS transistor, is turned on to short-circuit the second resistor R2. In this case, only the first resistor R1 is connected to the second power supply voltage V2 to serve as a pull-up resistor. The second MOS transistor Q2 is turned off because it is a PMOS transistor. The third MOS transistor Q3 is controlled by a level output by the second output terminal Dos of the logic control subunit Log to be turned on or off. In this case, the third MOS transistor Q3 in the driver unit and the pull-up resistor, that is the first resistor R1, in the next adjacent driver unit constitute an open-drain output structure, and the pull-up resistor in the driver unit and the third MOS transistor Q3 in the last adjacent driver unit also constitute an open-drain output structure.

When the first output terminal Dos of the logic control subunit Log outputs a low level, the first MOS transistor Q1 is turned off. In this case, the second resistor R2 is not short-circuited, and is connected in series with the first resistor R1 to jointly serve as a pull-up resistor. The second MOS transistor Q2 is turned on to constitute a CMOS output structure together with the third MOS transistor Q3. The first MOS transistor Q1, as an NMOS transistor, is turned off by the low level. In this case, the second resistor R2 is not short-circuited, and is connected in series with the first resistor R1 to jointly serve as a pull-up resistor. To reduce losses of the driver unit and increase a transmission speed of the CMOS output structure, the second resistor R2 may be set to a large resistance value. For example, the second resistor R2 is set to 150 KΩ, and the first resistor R1 is set to 10 KΩ. When the driver unit is of the open-drain output structure, the pull-up resistor of the driver unit is 10 KΩ. When the driver unit is of the CMOS output structure, the pull-up resistor of the driver unit is increased to 160 KΩ, which reduces a current flowing through the first resistor R1 and the second resistor R2, thereby reducing the losses of the driver unit, and increasing the transmission speed of the CMOS output structure.

It should be noted that after receiving a control instruction from the input terminal Dis of the driver unit, the logic control subunit Log reads control information corresponding to the driver unit from the control instruction, and outputs the control information from the first output terminal Dos thereof. The remaining control information is output from the second output terminal Dos of the logic control subunit, and is output to the next adjacent driver unit. The control instruction is specifically a data packet, and includes control information of each driver unit in one cascaded module A1.

Figure 3:
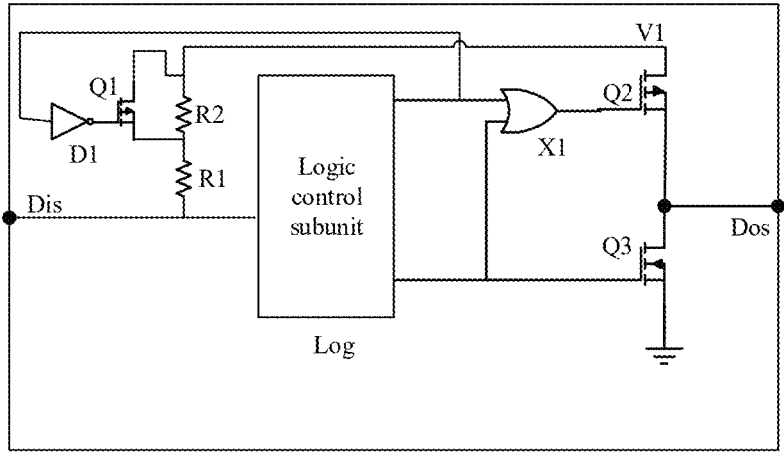
FIG. 3 is a second circuit structure diagram of a driver unit according to a first embodiment of the present application.

Referring to FIG. 3, as a preferred implementation, the driver unit includes a first MOS transistor Q1, a second MOS transistor Q2, a third MOS transistor Q3, a phase inverter D1, an OR gate X1, a first resistor R1, a second resistor R2, and a logic control subunit Log.

A first terminal of the first resistor R1 and an input terminal Dis of the logic control subunit Log are both coupled to an input terminal Dis of the driver unit, a second terminal of the first resistor R1 is coupled to a first terminal of the second resistor R2, and a second terminal of the second resistor R2 is coupled to the first power supply voltage V1. A first terminal and a second terminal of the first MOS transistor Q1 are respectively coupled to the first terminal and the second terminal of the second resistor R2. An input terminal Dis and an output terminal Dos of the phase inverter D1 are respectively coupled to a first output terminal Dos of the logic control subunit Log and a gate of the first MOS transistor Q1. The first output terminal Dos of the logic control subunit Log is further coupled to an input terminal Dis of the OR gate X1, and a second output terminal Dos of the logic control subunit Log is separately coupled to a gate of the third MOS transistor Q3 and the input terminal Dis of the OR gate X1. An output terminal Dos of the OR gate X1 is coupled to a gate of the second MOS transistor Q2. A second terminal of the second MOS transistor Q2 is coupled to the first power supply voltage V1, and a first terminal of the second MOS transistor Q2 is coupled to a first terminal of the third MOS transistor Q3, and serves as an output terminal Dos of the driver unit. A second terminal of the third MOS transistor Q3 is grounded.

Specifically, the first MOS transistor Q1 and the second MOS transistor Q2 each include a PMOS transistor; the third MOS transistor Q3 includes an NMOS transistor; if the first output terminal Dos of the logic control subunit Log outputs a high level, the driver unit is switched to the open-drain output structure, and if the first output terminal Dos of the logic control subunit Log outputs a low level, the driver unit is switched to the CMOS output structure.

Referring to FIG. 3, its principle is as follows:

When the first output terminal Dos of the logic control subunit Log outputs a high level, the high level is changed to a low level by the phase inverter D1 to act on the gate of the first MOS transistor Q1, and the first MOS transistor Q1, as a PMOS transistor, is turned on to short-circuit the second resistor R2. In this case, only the first resistor R1 is connected to the second power supply voltage V2 to serve as a pull-up resistor. The second MOS transistor Q2 is turned off because it is a PMOS transistor. The third MOS transistor Q3 is controlled by a level output by the second output terminal Dos of the logic control subunit Log to be turned on or off. In this case, the third MOS transistor Q3 in the driver unit and the pull-up resistor, that is the first resistor R1, in the next adjacent driver unit constitute an open-drain output structure, and the pull-up resistor in the driver unit and the third MOS transistor Q3 in the last adjacent driver unit also constitute an open-drain output structure.

When the first output terminal Dos of the logic control subunit Log outputs a low level, the low level is changed to a high level by the phase inverter D1 to act on the gate of the first MOS transistor Q1, and the first MOS transistor Q1 is turned off. In this case, the second resistor R2 is not short-circuited, and is connected in series with the first resistor R1 to jointly serve as a pull-up resistor. The second MOS transistor Q2 is turned on because it is a PMOS transistor, to constitute a CMOS output structure together with the third MOS transistor Q3.

As a specific implementation, the logic control subunit Log includes a memory.

The memory is configured to read a control instruction input by the input terminal Dis of the driver unit, so that the first output terminal Dos of the logic control subunit Log outputs a high level or a low level.

Figure 4:
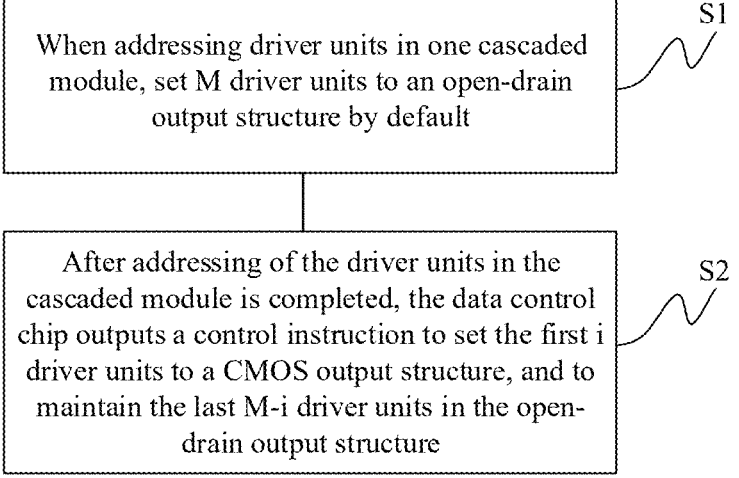
FIG. 4 is a flowchart of a control method for a multi-power-supply display system according to a second embodiment of the present application.

Referring to FIG. 1 and FIG. 4, according to a second implementation of the present application, provided is a control method for a multi-power-supply display system, used to control the multi-power-supply display system, including:

S1: When the data control chip addresses driver units in one cascaded module A1, M driver units are all set to an open-drain output structure by default.

S2: After the data control chip completes addressing of the driver units in the cascaded module A1, the data control chip outputs a control instruction to set the first i driver units to a CMOS output structure, to solve a power consumption problem of the open-drain output structure, and to maintain the last M−i driver units in the open-drain output structure, to solve a problem of the increase of a circuit area of the system due to that a level conversion circuit needs to be additionally disposed in the CMOS output structure.

Specifically, take a cascaded module A1 in which one hundred driver units are cascaded as an example.

The one hundred driver units are all set to the open-drain output structure when delivered from the factory. A specific setting manner is as follows: A first output terminal Dos of a logic control subunit Log in each driver unit is set to a high level. When a data control chip addresses all the driver units, the driver units are all maintained in the open-drain output structure. After addressing of all the driver units is completed, the data control chip outputs a control instruction to switch the first ninety driver units to the CMOS output structure, and to maintain the last ten driver units in the open-drain output structure. As a preferred implementation, the data control chip outputs a control instruction to switch the first ninety-nine driver units to the CMOS output structure, and to maintain the last driver unit in the open-drain output structure, to maximally reduce power consumption of the system and increase a data transmission rate. Certainly, specific settings may be adjusted according to requirements, and are not limited here. A specific switching manner is as follows: The high level set for the first output terminals Dos of the logic control subunits Log in the first ninety-nine driver units is switched to a low level.

In summary, according to the multi-power-supply display system according to the first embodiment of the present application, and the control method for a multi-power-supply display system according to the second embodiment of the present application, the CMOS output structure and the open-drain output structure are both integrated into the driver unit, the output structure in the driver unit is switched by using the data control chip, and when addressing driver units in one cascaded module A1, the interior of the driver unit is set to the open-drain output structure by default, and after addressing of the driver units in the cascaded module A1 is completed, the data control chip outputs the control instruction to set all the first i driver units to the CMOS output structure, and to maintain all the last M–i driver units in the open-drain output structure, so as to reduce the pull-up resistors and meanwhile eliminate level conversion circuits.

According to a third embodiment of the present application, provided is a display device, including the multi-power-supply display system.

Finally, it should be noted that: the above embodiments are merely used to illustrate the technical solutions of the present application, instead of imposing any limitation on the present application. Although the present application has been described in detail with reference to the above embodiments, those with ordinary skills in the art should understand that: the technical solutions disclosed in the above embodiments may be modified, or a part or all of the technical features thereof may be replaced equivalently. These modifications or replacements are not intended to make the essence of corresponding technical solutions depart from the scope of the technical solutions of the embodiments of the present application.

The invention claimed is:

1. A multi-power-supply display system, comprising: a data control chip, N cascaded modules, and N pull-up resistors, wherein each cascaded module comprises M driver units connected in series and correspondingly controlled LED units; an input terminal of the first driver unit is coupled to an output terminal of the data control chip, an output terminal of an $M^{th}$ driver unit is coupled to an input terminal of the data control chip, and each driver unit is coupled to a first power supply voltage; each driver unit is integrated with a CMOS output structure and an open-drain output structure;

the data control chip is configured to receive front-end data, and output a corresponding control instruction to the first driver unit of a corresponding cascaded module according to the front-end data, to control each driver unit in the corresponding cascaded module to be switched between the CMOS output structure and the open-drain output structure;

each pull-up resistor is corresponding to one cascaded module, and is coupled between an output terminal of the corresponding cascaded module and a second power supply voltage; and the second power supply voltage is used to supply power to the data control chip, and the first power supply voltage is greater than the second power supply voltage, wherein both N and M are positive integers, N≥1, and M≥1.

2. The multi-power-supply display system according to claim 1, wherein the driver unit comprises a first MOS transistor, a second MOS transistor, a third MOS transistor, an OR gate, a first resistor, a second resistor, and a logic control subunit;

a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; a first output terminal of the logic control subunit is respectively coupled to an input terminal of the OR gate and a gate of the first MOS transistor, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded.

3. The multi-power-supply display system according to claim 2, wherein the first MOS transistor and the third MOS transistor each comprise an NMOS transistor; the second MOS transistor comprises a PMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

4. A control method for a multi-power-supply display system, used to control the multi-power-supply display system according to claim 3, comprising:

when addressing driver units in one cascaded module, setting all M driver units to an open-drain output structure by default; and after addressing of the driver units in the cascaded module is completed, outputting, by the data control chip, a control instruction to set the first i driver units to a CMOS output structure, and to maintain the last M–i driver units in the open-drain output structure, wherein i is a positive integer, and 1≤i<M.

5. The control method for a multi-power-supply display system according to claim 4, wherein the setting all M driver units to an open-drain output structure by default specifically comprises: setting a first output terminal of a logic control subunit in each driver unit to output a high level by default.

6. The control method for a multi-power-supply display system according to claim 5, wherein the outputting, by the data control chip, a control instruction to set the first i driver units to a CMOS output structure specifically comprises: after the first i driver units read the control instruction, switching a high level output by a first output terminal of a respective logic control subunit to a low level.

7. The multi-power-supply display system according to claim 2, wherein the logic control subunit comprises a memory; and the memory is configured to read a control instruction input by the input terminal of the driver unit, so that the first output terminal of the logic control subunit outputs a high level or a low level.

8. The control method for a multi-power-supply display system according to claim 4, wherein the driver unit comprises a first MOS transistor, a second MOS transistor, a third MOS transistor, a phase inverter, an OR gate, a first resistor, a second resistor, and a logic control subunit;

a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; an input terminal and an output terminal of the phase inverter are respectively coupled to a first output terminal of the logic control subunit and a gate of the first MOS transistor; the first output terminal of the logic control subunit is further coupled to an input terminal of the OR gate, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded;

the first MOS transistor and the second MOS transistor each comprise a PMOS transistor; the third MOS transistor comprises an NMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

9. The multi-power-supply display system according to claim 1, wherein the driver unit comprises a first MOS transistor, a second MOS transistor, a third MOS transistor, a phase inverter, an OR gate, a first resistor, a second resistor, and a logic control subunit;

a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; an input terminal and an output terminal of the phase inverter are respectively coupled to a first output terminal of the logic control subunit and a gate of the first MOS transistor; the first output terminal of the logic control subunit is further coupled to an input terminal of the OR gate, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded.

10. The multi-power-supply display system according to claim 9, wherein the first MOS transistor and the second MOS transistor each comprise a PMOS transistor; the third MOS transistor comprises an NMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

11. The multi-power-supply display system according to claim 9, wherein the logic control subunit comprises a memory; and the memory is configured to read a control instruction input by the input terminal of the driver unit, so that the first output terminal of the logic control subunit outputs a high level or a low level.

12. A display device, comprising the multi-power-supply display system according to claim 1.

13. The display device according to claim 12, wherein the driver unit comprises a first MOS transistor, a second MOS transistor, a third MOS transistor, an OR gate, a first resistor, a second resistor, and a logic control subunit;

a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; a first output terminal of the logic control subunit is respectively coupled to an input terminal of the OR gate and a gate of the first MOS transistor, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded.

14. The display device according to claim 13, wherein the first MOS transistor and the third MOS transistor each comprise an NMOS transistor; the second MOS transistor comprises a PMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

15. The display device according to claim 13, wherein the logic control subunit comprises a memory; and the memory is configured to read a control instruction input by the input terminal of the driver unit, so that the first output terminal of the logic control subunit outputs a high level or a low level.

16. The display device according to claim 12, wherein the driver unit comprises a first MOS transistor, a second MOS transistor, a third MOS transistor, a phase inverter, an OR gate, a first resistor, a second resistor, and a logic control subunit;

a first terminal of the first resistor and an input terminal of the logic control subunit are both coupled to an input terminal of the driver unit, a second terminal of the first resistor is coupled to a first terminal of the second resistor, and a second terminal of the second resistor is coupled to the first power supply voltage; a first terminal and a second terminal of the first MOS transistor are respectively coupled to the first terminal and the second terminal of the second resistor; an input terminal and an output terminal of the phase inverter are respectively coupled to a first output terminal of the logic control subunit and a gate of the first MOS transistor; the first output terminal of the logic control subunit is further coupled to an input terminal of the OR gate, and a second output terminal of the logic control subunit is separately coupled to a gate of the third MOS transistor and the input terminal of the OR gate; an output terminal of the OR gate is coupled to a gate of the second MOS transistor; a second terminal of the second MOS transistor is coupled to the first power supply voltage, and a first terminal of the second MOS transistor is coupled to a first terminal of the third MOS transistor, and serves as an output terminal of the driver unit; and a second terminal of the third MOS transistor is grounded.

17. The display device according to claim 16, wherein the first MOS transistor and the second MOS transistor each comprise a PMOS transistor; the third MOS transistor comprises an NMOS transistor;

if the first output terminal of the logic control subunit outputs a high level, the driver unit is switched to the open-drain output structure; and if the first output terminal of the logic control subunit outputs a low level, the driver unit is switched to the CMOS output structure.

* * * * *